United States Patent
Gonzalez

[11] Patent Number: 6,111,282
[45] Date of Patent: Aug. 29, 2000

[54] CHARGE-PUMPING TO INCREASE ELECTRON COLLECTION EFFICIENCY

[75] Inventor: Fernando Gonzalez, Boise, Id.

[73] Assignee: Micron Technology, Inc., Boise, Id.

[ * ] Notice: This patent is subject to a terminal disclaimer.

[21] Appl. No.: 09/306,078

[22] Filed: May 6, 1999

Related U.S. Application Data

[63] Continuation of application No. 08/897,492, Jul. 21, 1997, Pat. No. 5,959,323, which is a continuation of application No. 08/550,917, Oct. 31, 1995, Pat. No. 5,698,877.

[51] Int. Cl.[7] .......................... H01L 27/108; H01L 29/76
[52] U.S. Cl. .......................... 257/299; 257/548; 257/551; 327/536
[58] Field of Search ................................. 257/548, 549, 257/299, 547, 551; 327/536

[56] References Cited

U.S. PATENT DOCUMENTS

| | | | |
|---|---|---|---|
| 3,794,862 | 2/1974 | Jenne | 327/536 |
| 4,115,794 | 9/1978 | De La Moneda | 257/299 |
| 4,460,835 | 7/1984 | Masuoka | 327/536 |
| 4,571,505 | 2/1986 | Eaton, Jr. | 327/536 |
| 4,670,669 | 6/1987 | Cottrell et al. | 257/551 |
| 4,890,149 | 12/1989 | Bertotti et al. | 257/547 |
| 5,289,025 | 2/1994 | Lee | 257/299 |
| 5,394,365 | 2/1995 | Tsukikawa | 365/189.09 |
| 5,467,307 | 11/1995 | D'Arrigo et al. | 257/549 |
| 5,489,870 | 2/1996 | Arakawa | 327/536 |
| 5,521,871 | 5/1996 | Choi | 365/189.11 |
| 5,565,701 | 10/1996 | Zambrano | 257/549 |
| 5,698,877 | 12/1997 | Gonzalez | 257/299 |

*Primary Examiner*—Donald L. Monin, Jr.
*Attorney, Agent, or Firm*—Trask Britt

[57] ABSTRACT

A tub structure underlying a first well in a semiconductor integrated circuit is charge pumped to increase electron collection efficiency in the tub structure. A charge pumping circuit applies the biasing voltage via a second well. The current in the tub structure is monitored to determine when to pump charge into the tub structure. The pumping biases the n-tub to voltages as high as twice the supply voltage magnitude, ($2V_{cc}$). The tub current is compared to a minimum current threshold and a maximum current threshold. The charge pump is disabled when the tub current exceeds the maximum threshold and is turned on before the tub current goes below the minimum threshold. The maximum threshold is for keeping the tub structure from exhibiting an undesirable standby current. The minimum threshold is to keep the tub structure biased enough to achieve a desired electron collection efficiency.

14 Claims, 4 Drawing Sheets

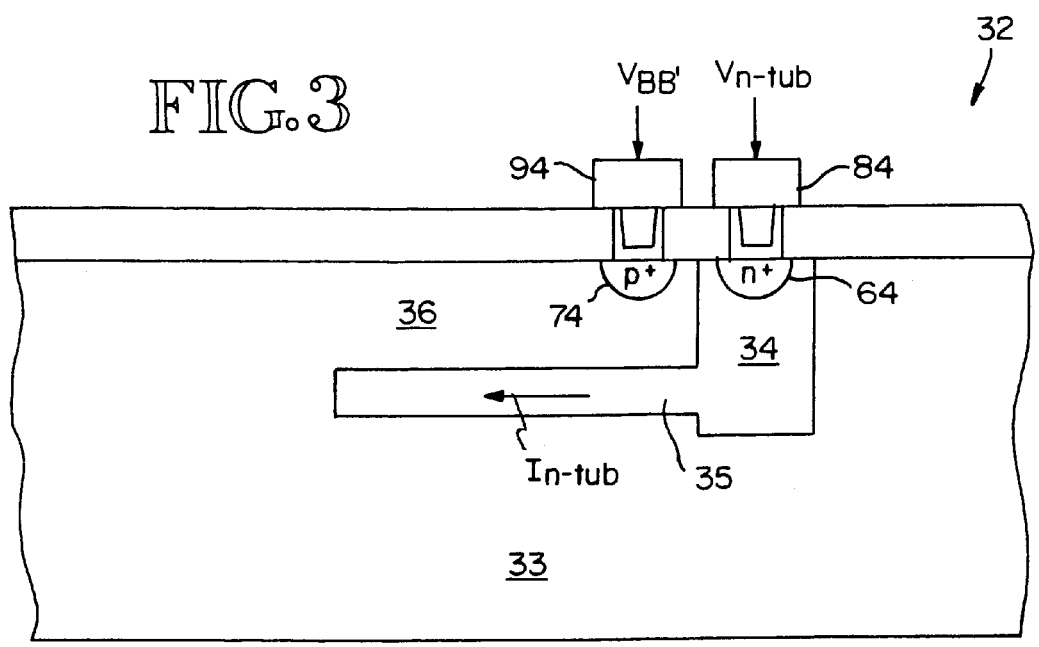
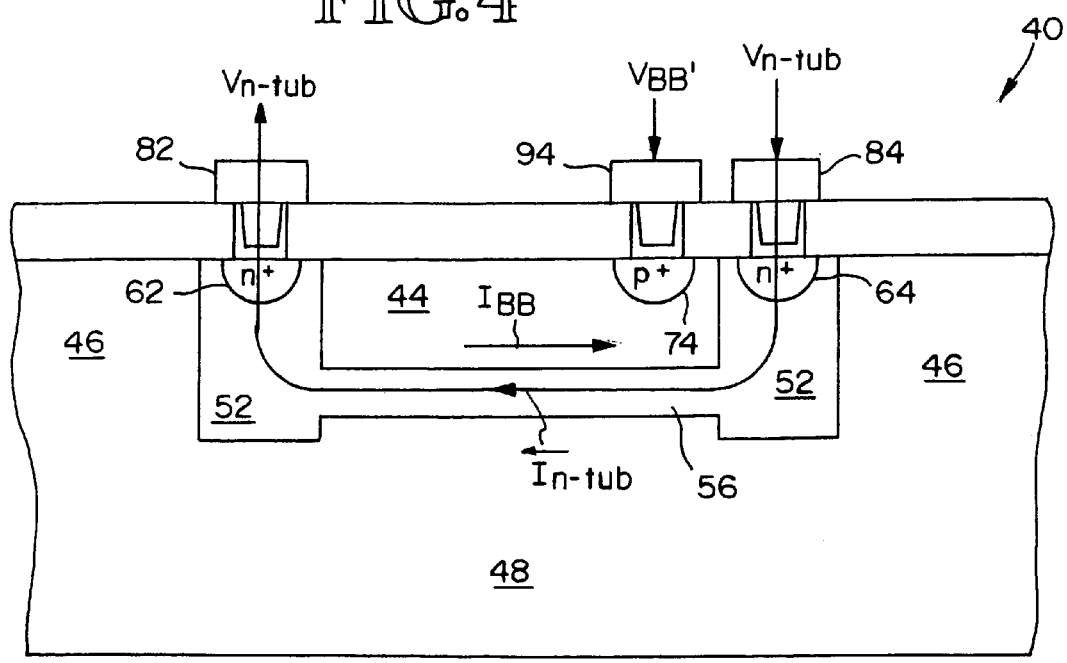

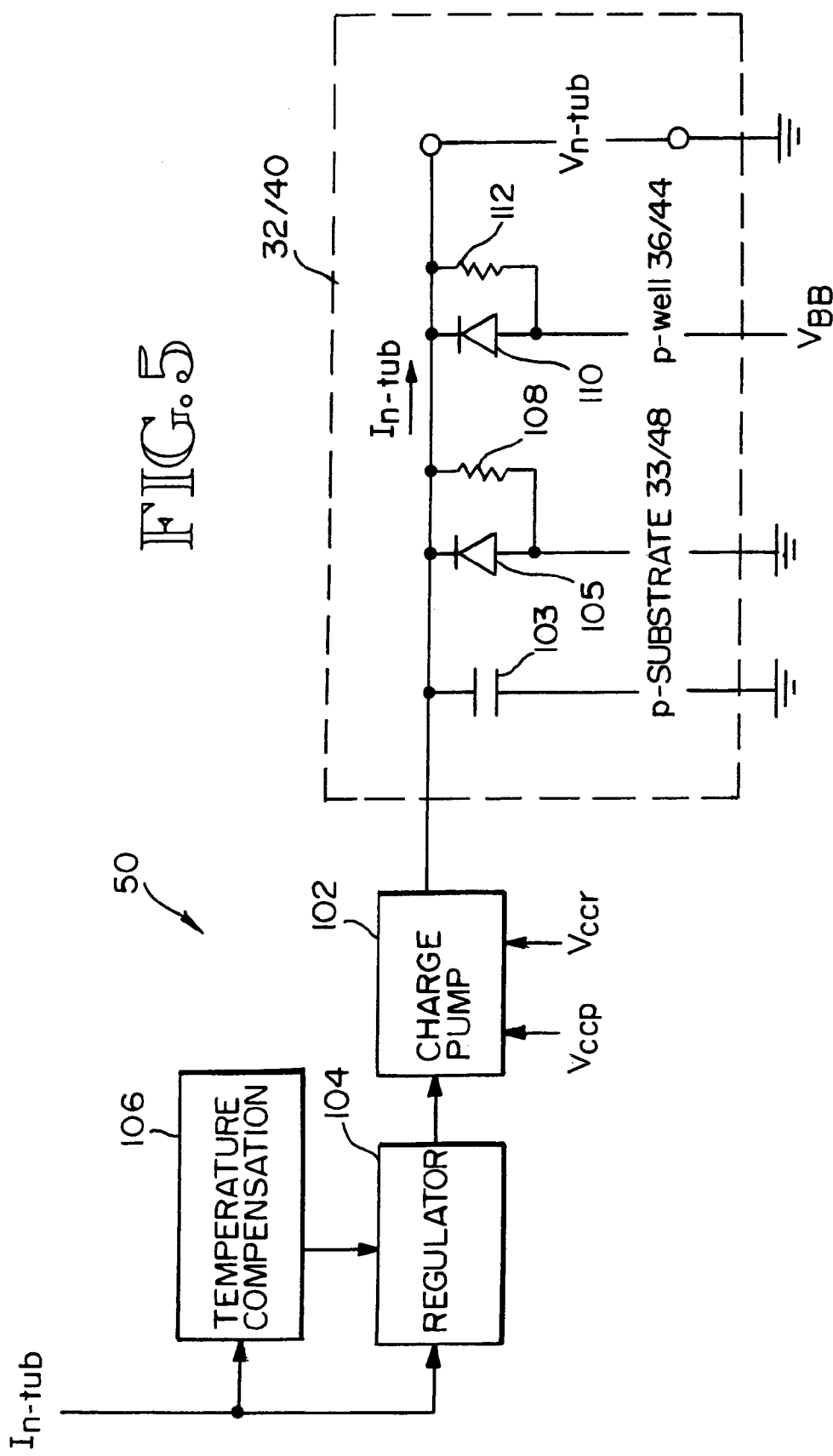

FIG. 6
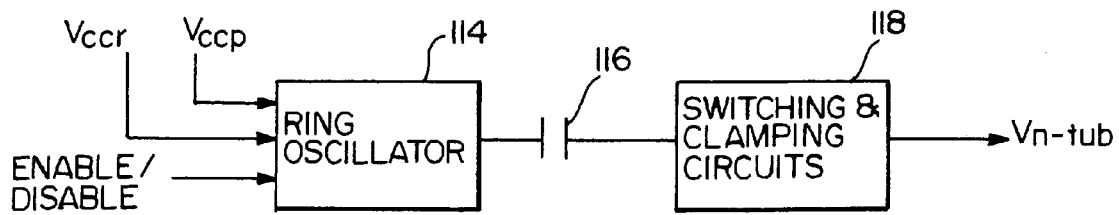
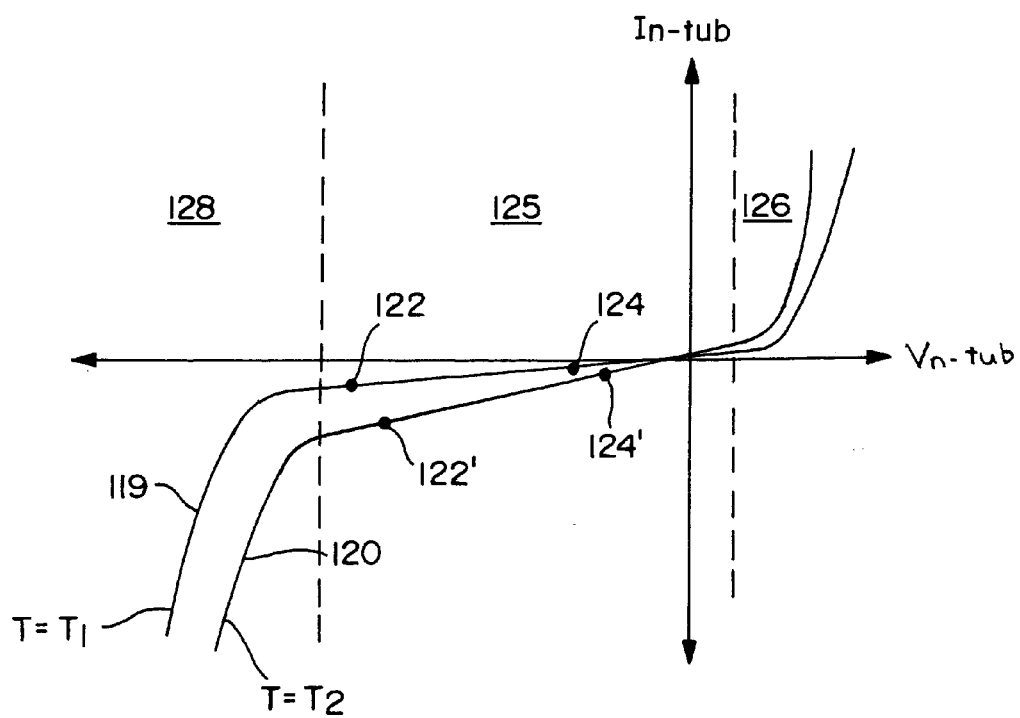
FIG. 7

CHARGE-PUMPING TO INCREASE ELECTRON COLLECTION EFFICIENCY

CROSS REFERENCE TO RELATED APPLICATIONS

This application is a continuation of application Ser. No. 08/897,492, filed Jul. 21, 1997, now U.S. Pat. No. 5,959,323, which is a continuation of application Ser. No. 08/550,917, filed Oct. 31, 1995, now U.S. Pat. No. 5,698,877, issued Dec. 16, 1997.

BACKGROUND OF THE INVENTION

This invention relates to methods and apparatus for biasing a semiconductor region and more particularly, to a method and apparatus for improving electron collection efficiency at a semiconductor region to reduce junction leakage.

Integrated circuits (ICs) are typically fabricated on a semiconductor wafer. The wafer typically is cut to form multiple semiconductor substrates or "IC chips". Semiconductor devices are formed on the wafer. Although the label "semiconductor" is used, the devices are fabricated from various materials, including electrical conductors (e.g., aluminum, tungsten), electrical semiconductors (e.g., silicon) and insulators (e.g., silicon dioxide). The semiconductive silicon wafer is subjected to deposition, etching, planarizing and lithographic processes to achieve the many semiconductor devices.

In fabricating semiconductor devices, substrates typically are doped to form various n-type and p-type regions. One layout structure is a well. FIG. 1 shows a p-type substrate 10 having a triple well. A center p-well 16 is surrounded by an n-well 20, which in turn is surrounded by another p-well 18. An n-tub 24 conjoins the n-well 20 and is formed below the center p-well 16. The center p-well 16 is separated from the p-type substrate 10 by the n-tub 24. Typically, one or more other doped regions 26 are included in the center p-well 16 to form an array of devices.

During normal operation, the n-tub 24 is biased to improve performance of a device array in the p-well 16. Specifically, the biasing voltage sets up an energy potential well in the n-tub 24 which collects electrons. As electrons fall into the energy potential well, they go into a lower energy state. Such electron collection reduces leakage of electrons across the junction into the p-well 16. For an array of DRAM cells, for example, the electron collection allows for a longer refresh period. Accordingly, it is desired that electron collection at the n-tub 24 be efficient.

The wider and deeper the energy potential well created, the more electrons that are collected. The factors determining the energy potential well performance include the biasing voltage and the doping level of the n-tub. Conventionally, the biasing voltage is limited to the supply voltage level. The doping level typically is limited to keep the n-tub from spreading too close to the surface.

When forming the p-well 16 and n-tub 24, the p-substrate 10 typically is doped in an area which is to become the n-tub. The n-tub, thus, defines a separation between pre-existing p-type regions. The doping process is an implantation of atoms. Implantation power defines how deep into the substrate the atoms are injected. Dosage level defines the number of atoms being injected, which affects the width of the n-tub junction for a given diffusion time. Typically, the implantation power is limited (e.g., 3 MeV maximum power) and, correspondingly, a maximum depth is defined.

To maximize electron collection efficiency, it would seem that very high doping levels would be desired. However, because the doping level affects the width of the n-tub junction, excessive doping would expand the n-tub junction too close to the surface. More particularly, the n-tub junction would expand too close to other n-type regions formed or to be formed in the center p-well. FIG. 2 shows such an example. Beyond a given n-tub 24' thickness, an adjacent p-well 16' separation gets too small. Specifically, the p-well 16' separating the n-tub 24' from a nearby n-type region 28 in the p-well 16' becomes less than a minimum spacing required for region isolation. For a separation in the p-well 16' region between n-tub 24' and n-type area 28 which is less than the threshold separation, the local area defines an undesired "parasitic" leakage path (in effect, an undesired npn device 30). In order to avoid such a leakage path, the dosage for the n-tub is typically scaled back during the design process to keep the n-tub thickness to an acceptable level. A disadvantage of scaling the dosage back, however, is that the n-tub is comparatively less effective in collecting electrons.

Accordingly, there is need for improving collection of electrons at an n-tub.

SUMMARY OF THE INVENTION

According to the invention, an n-tub is charge pumped via an n-well to increase electron collection efficiency at the n-tub. This increases the bias of the n-tub beyond conventional levels. Specifically, whereas prior methods limit the bias voltage to be up to the supply voltage magnitude, $V_{cc}$, charge pumping enables boosted bias voltages at the n-tub which are as high as $2V_{cc}$. The increased biasing of the n-tub creates an energy potential well of increased width and depth. Thus, more electrons are able to fall into the well and move to a lower energy level. This results in improved effectiveness of the n-tub. With the n-tub being more effective, fewer electrons are able to cross a junction into the adjacent p-well. Thus, junction leakage current is reduced. This improves performance of devices residing in the p-well.

According to one aspect of the invention, a charge pumping circuit applies the biasing voltage, $V_{n-tub}$, at an n-well. The n-well is conjoined to the n-tub and located adjacent to the p-well of interest.

According to another aspect of the invention, the resulting current in the n-tub, $I_{n-tub}$, is monitored to determine when to pump charge into the n-tub. The pumping biases the n-tub to voltages as high as twice the supply voltage magnitude (i.e., $2V_{cc}$).

According to another aspect of the invention, the n-tub current $I_{n-tub}$ is compared to a minimum current threshold and a maximum current threshold. The charge pump is disabled when the current $I_{n-tub}$ exceeds the maximum threshold and is turned on before the current $I_{n-tub}$ goes below the minimum threshold. The maximum threshold is for keeping the n-tub from exhibiting an undesirable standby current. The minimum threshold is to keep the n-tub biased enough to achieve a desired electron collection efficiency.

In a preferred embodiment, a host integrated circuit includes adjacent first and second well structures, a tub structure, a charge pump circuit and a regulator circuit. The first well structure and the substrate are of a first doping type. The second well and tub structure are of a second doping type, and are conjoined. The first doping type is either one of p-type or n-type and the second doping type is the other one of p-type or n-type. The first well structure is separated from the substrate by the tub structure. A biasing voltage (e.g., $V_{n-tub}$) is applied to the tub structure via the second well, creating a tub current (e.g., $I_{n-tub}$).

The charge pump circuit has an enable state and a disable state. During the enable state, the charge pump circuit pumps charge into the tub structure to bias the tub structure to a bias voltage magnitude exceeding substrate supply voltage magnitude (i.e., $V_{n-tub} > V_{cc}$). The regulator circuit monitors the n-tub current to test the n-tub current relative to a minimum current threshold and a maximum current threshold. The charge pump circuit responds to the regulator circuit to switch into the disable state when the n-tub current magnitude rises to the maximum current threshold. The charge pump circuit switches from the disable state to the enable state when the n-tub current magnitude falls to the minimum current threshold. The regulator circuit prevents the charge pump circuit from forward biasing the tub structure.

One advantage of the invention is that any decrease in electron collection effectiveness caused by compromising dosage of the n-tub is made up for by charge pumping the n-tub to accept more electrons. Thus, the charge-pumped structure exhibits improved n-tub electron collection effectiveness. These and other aspects and advantages of the invention will be better understood by reference to the following detailed description taken in conjunction with the accompanying drawings.

BRIEF DESCRIPTION OF THE SEVERAL VIEWS OF THE DRAWING

FIG. 3 is a cross-sectional view of an integrated circuit having an n-tub charge pumped according to an embodiment of this invention;

FIG. 4 is a cross-sectional view of a triple well having an n-tub charge pumped according to an embodiment of this invention;

FIG. 5 is an electrical block diagram and partial schematic of the circuits of FIG. 3 or FIG. 4 according to an embodiment of this invention;

FIG. 6 is a block diagram of the charge pump of FIG. 5; and

FIG. 7 is a chart of current versus voltage characteristic curves for the n-tub of FIGS. 3 and 4.

DETAILED DESCRIPTION OF THE INVENTION

Overview

Figure 1:
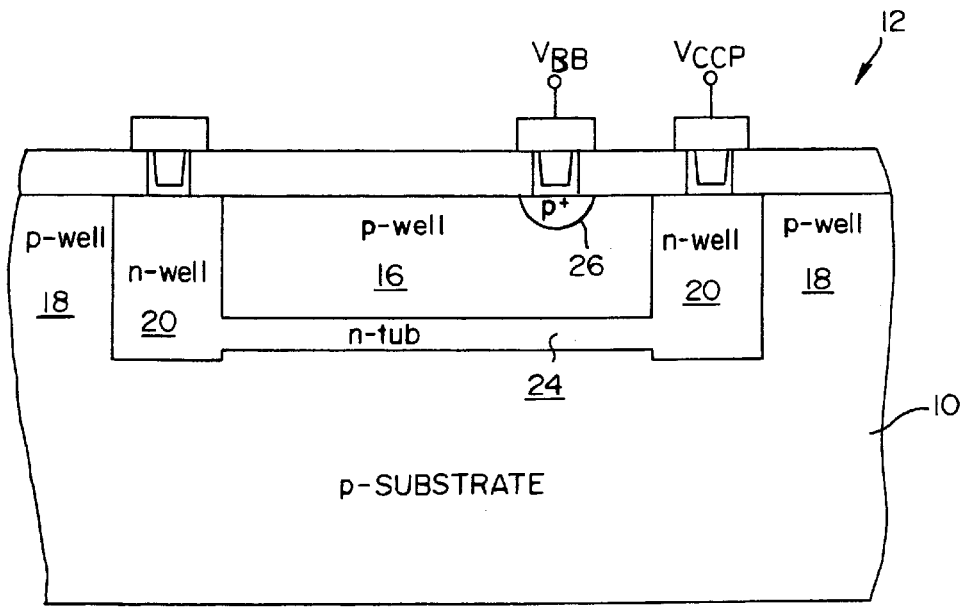
FIG. 1 is a cross-sectional view of a conventional semiconductor triple well.
Figure 2:
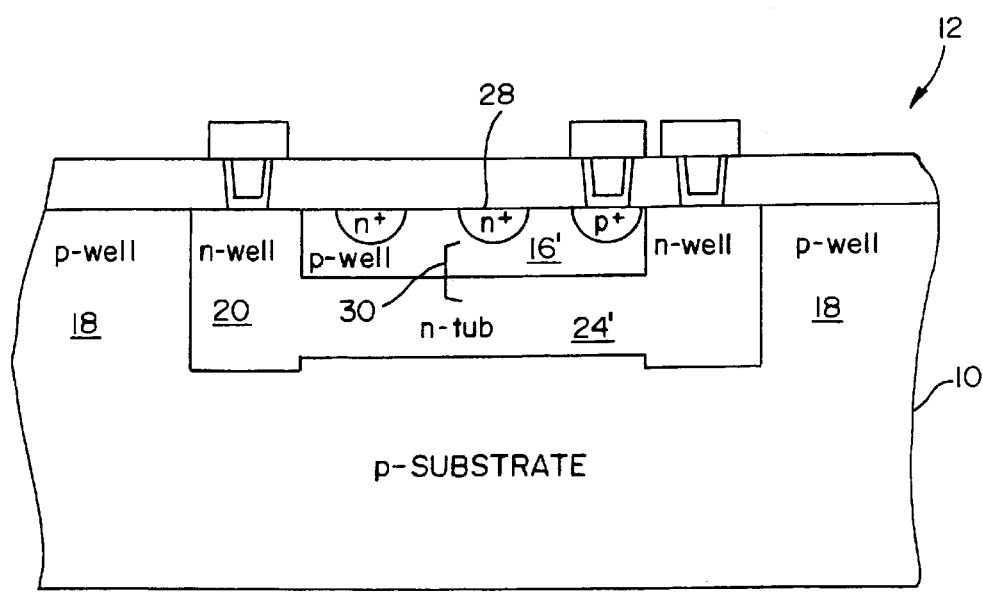
FIG. 2 is a cross-sectional view of a defective semiconductor triple well.

FIG. 3 shows a portion of a semiconductor integrated circuit 32 at an intermediate step in its fabrication process. A p-type substrate 33 has an n-well 34 and an n-tub 35 formed so as to define a p-well 36. The n-tub 35 is charge-pumped during operation. Specifically, a bias voltage is applied at a contact 84, resulting in a bias voltage signal at n-well 34 and n-tub 35. The charge pumping creates a bias voltage at the n-tub 35 which is as high as twice the supply voltage magnitude ($V_{cc}$). This increased biasing increases the energy potential well of the n-tub and counters any inherent inefficiency characteristic attributable to the n-tub doping level. The result is effective electron collection at the n-tub. Typically, an array of devices is formed in the p-well 36 and/or n-well 34.

Triple Well Embodiment

FIG. 4 shows a triple well 40 embodiment of this invention. The triple well structure is a device layout on a semiconductor substrate. For convenience and clarity, the structure is illustrated and described for two p-wells on a p-substrate separated by an n-well. An n-tub isolates a central p-well from the p-substrate. Alternative embodiments, however, include two n-wells on an n-type substrate separated by a p-well. A p-tub isolates the central n-tub from the n-substrate.

The triple well structure is implemented in various embodiments for many alternative devices. Exemplary devices include SRAMs, DRAMs, flash memory cells, processor components, logic devices and other devices for CMOS, MOS and other semiconductor technologies. Typically, an array of devices is formed in the center well.

The triple well 40 is formed by a center p-well 44 and an outer p-well 46 separated by an intermediary n-well 52. The wells are formed on a p-type substrate 48. The central p-well 44 is isolated from the p-type substrate 48 by an n-tub 56. The n-tub 56 extends from beneath the center p-well 44 to the concentric surrounding n-well 52. Also illustrated are more densely doped regions 62, 64, 74 adjacent to electrical contacts 82, 84, 94. The n-doped region 62 of n-well 52 is adjacent to contact 82. The n-doped region 64 of n-well 52 is adjacent to contact 84. The p-doped region 74 of p-well 44 is adjacent to contact 94. Although not illustrated, in specific embodiments, any one or more of the p-wells 44 and 46 further includes one or more doped regions of the same or opposite polarity. Similarly, in specific embodiments, the n-well 52 further includes one or more doped regions of the same or opposite polarity. These additionally doped regions define an array of devices.

According to conventional operation, the n-well 52 receives a supply voltage $V_{cc}$ as a biasing voltage (see comparative structures in FIG. 1). According to the invention, however, the n-well 52 is coupled to a charge pump which creates a bias voltage $V_{n-tub}$ as high as $2V_{cc}$.

Charge Pumping Schematic

FIG. 5 shows the electrical schematic of the p-type substrate 33/48 with related circuitry 50 according to an embodiment of this invention. The p-type substrate 33/48 is represented schematically as (i) a capacitor 103, defined by the junction between the n-tub 35/56 and p-type substrate 33/48, (ii) a diode 105 and resistor 108, defined by the junction leakage between the n-tub 35/56 and p-type substrate 33/48, and (iii) a diode 110 and resistor 112, defined by the junction leakage between the n-tub 35 and the p-well 36/44. The related circuitry 50 includes a charge pump 102, regulator circuit 104, and a temperature compensation circuit 106.

The charge pump 102 injects electrons into the n-tub 35/56 via the n-well 34/52. Referring to FIG. 6, in one embodiment, the charge pump 102 includes a ring oscillator 114, a capacitor 116 (e.g., MOS capacitor or polysilicon to polysilicon capacitor) and switching and clamping circuits 118. The ring oscillator 114 receives the voltage $V_{cc}$ and an enable/disable signal. When enabled, the ring oscillator 114 generates pulses for charging the capacitor 116. The capacitor 116 outputs a signal which in effect stretches the pulses. The switching and clamping circuits 118 then serve to shape the resulting signal to approximate a dc signal. The result is a signal with voltage, $V_{n-tub}$, and a current, $I_{n-tub}$.

Referring again to FIG. 5, the regulator circuit 104 determines when the charge pump is enabled or disabled. When the n-tub current, $I_{n-tub}$, dwindles to a minimum threshold, the regulator circuit 104 activates the charge pump 102. When the n-tub current reaches a maximum threshold, the regulator circuit 104 disables the charge pump 102.

In one embodiment, the temperature compensation circuit 106 defines the minimum and maximum thresholds as a function of substrate temperature. In other embodiments, only the minimum thresholds are varied as a function of substrate temperature. The compensation circuit 106 is formed by known semiconductor-resident circuit structures. The charge pump 102, regulator circuit 104 and temperature compensation circuit 106, like the triple well 40, are integral to the host semiconductor.

Charge Pumping Method

The purpose of charge pumping the n-tub 35/56 is to bias the region to collect more electrons. When pumping to high bias voltages (e.g., greater than $V_{cc}$), it is desirable to avoid adversely impacting the center p-well 36/44. In one embodiment, the outer p-well 46 is grounded, while a voltage $V_{BB}$ is applied to center p-well 36/44 and a bias voltage $V_{n\text{-}tub}$ bis applied to the n-well 34/52 (embodiment illustrated). In an alternative embodiment, the outer p-well 46 receives a voltage $V_{BB}$, while the center p-well 44 is grounded and a bias voltage $V_{n\text{-}tub}$ is applied to the n-well 52. It is preferable to avoid a high bias voltage $V_{n\text{-}tub}$ (e.g., $V_{n\text{-}tub} > V_{cc}$) which may adversely impact the current in the center p-well 36/44. Accordingly, the n-tub current, $I_{n\text{-}tub}$ is monitored and compared to threshold currents to determine whether to enable or disable the charge pump 102.

The n-tub current, $I_{n\text{-}tub}$ is input to the regulator circuit 104. If the current $I_{n\text{-}tub}$ reaches a maximum current threshold, the regulator circuit 104 disables the charge pump 102 to avoid an undesirable standby current in the center well 36/44. As the current magnitude falls in response to a falling bias at the n-tub 35/56, the current $I_{n\text{-}tub}$ approaches a minimum current threshold. Once the minimum current threshold is reached, the regulator circuit 104 enables the charge pump. The minimum current threshold is selected as a level corresponding to a minimum tolerated electron collection efficiency at the n-tub 35/56.

The minimum current threshold varies with the temperature of the circuitry. Accordingly, in some embodiments, the temperature compensation circuit 106 is included for varying the minimum threshold as a function of-temperature.

FIG. 7 shows current voltage characteristic curves 119, 120 for biasing the n-tub. Note that the minimum current threshold 122 and the maximum current threshold 124 occur in the relatively flat region 125. It is preferable to avoid biasing the n-tub into the forward biased region 126, because of an undesirable standby current. One also does not want to bias the n-tub 35/56 into the avalanche breakdown region 128. Reverse bias into avalanche breakdown region 128 would undesirably compromise electron collection efficiency of the n-tub 35/56. Also note that there are different current voltage characteristic curves 119, 120 for differing operating temperatures. However, one still may desire to maintain a fixed maximum threshold. In other embodiments, only the minimum current threshold or both the minimum and maximum current thresholds are varied.

Meritorious and Advantageous Effects

One advantageous effect of the invention is that any compromise in electron collection effectiveness caused by reduced doping of the n-tub 35/56 is made up for by charge pumping the n-tub to accept more electrons. A meritorious effect is that circuits embodied in the center p-well 36/44 have improved operating efficiency.

Although a preferred embodiment of the invention has been illustrated and described, various alternatives, modifications and equivalents may be used. For example, although the triple well structures described and illustrated are p-type wells on p-type substrates, n-type wells on n-type substrates are used in alternative embodiments. Therefore, the foregoing description should not be taken as limiting the scope of the inventions which are defined by the appended claims.

What is claimed is:

1. A charge-pumped semiconductor device comprising:
   a p-type substrate with a top surface and a lower bulk region;
   an n-tub with first and second ends formed within said p-type substrate;
   an n-well formed in said p-type substrate electrically coupled to said n-tub at said first and said second ends;
   an inner p-well formed in said p-type substrate near said top surface and isolated from said lower bulk region by said n-tub and said n-well;
   an outer p-well surrounding and concentric to said n-well and electrically coupled to said lower bulk region; and
   charge pumping circuitry coupled to said n-well for generating a charge pumping signal for pumping charge into said n-tub.

2. The charge pumped semiconductor device of claim 1, wherein said charge pumping circuitry further comprises:
   a charge pump with an enable state and a disable state coupled to said n-well;
   a regulator circuit coupled to said charge pump for enabling and disabling said charge pump in accordance with at least one n-tub current threshold; and
   a temperature compensation circuit coupled to said regulator circuit for defining said at least one n-tub current threshold.

3. The charge pumped semiconductor device of claim 2, wherein said charge pump further comprises:
   a ring oscillator for generating signal pulses;
   a capacitor in series with said ring oscillator for stretching said signal pulses; and
   switching and clamping circuitry in series with said capacitor for shaping said stretched signal pulses and outputting said charge pumping signal with a voltage, $V_{n\text{-}tub}$, and a current, $I_{n\text{-}tub}$.

4. The charge pumped semiconductor device of claim 2, wherein said at least one n-tub current threshold includes a minimum current threshold that is a function substrate temperature.

5. The charge pumped semiconductor device of claim 4, wherein said at least one n-tub current threshold further includes a maximum current threshold that is a function of substrate temperature.

6. A method of charge pumping a first region of an integrated circuit comprising:
   providing an integrated circuit comprising:
      a p-type substrate with a top surface and a lower bulk region;
      an n-tub with first and second ends formed within said p-type substrate;
      an n-well formed in said p-type substrate electrically coupled to said n-tub at said first and said second ends;
      an inner p-well formed in said p-type substrate near said top surface and isolated from said lower bulk region by said n-tub and said n-well;
      an outer p-well surrounding and concentric to said n-well and electrically coupled to said lower bulk region; and
      charge pumping circuitry with an enable state and a disable state coupled to said n-well for generating a charge pumping signal for pumping charge into said n-tub;

applying VBB to said inner p-well of the integrated circuit;

pumping current into said n-tub via said n-well first region to bias the n-tub to a bias voltage magnitude exceeding supply voltage magnitude, $V_{CC}$;

testing said current relative to a maximum current threshold; and switching said charge pumping circuitry into said disable state when the current magnitude rises to said maximum current threshold.

7. The method of claim 6, further comprising:

testing said current relative to a minimum current threshold; and switching said charge pumping circuitry into said enable state when the current magnitude falls to said minimum current threshold.

8. A charge-pumped semiconductor device comprising:

a n-type substrate with a top surface and a lower bulk region;

an p-tub with first and second ends formed within said n-type substrate;

an p-well formed in said n-type substrate electrically coupled to said p-tub at said first and said second ends;

an inner n-well formed in said n-type substrate near said top surface and isolated from said lower bulk region by said p-tub and said p-well;

an outer n-well surrounding and concentric to said p-well and electrically coupled to said lower bulk region; and charge pumping circuitry coupled to said p-well for generating a charge pumping signal for pumping charge into said p-tub.

9. The charge pumped semiconductor device of claim 8, wherein said charge pumping circuitry further comprises:

a charge pump with an enable state and a disable state coupled to said p-well;

a regulator circuit coupled to said charge pump for enabling and disabling said charge pump in accordance with at least one p-tub current threshold; and a temperature compensation circuit coupled to said regulator circuit for defining said at least one p-tub current threshold.

10. The charge pumped semiconductor device of claim 9, wherein said charge pump further comprises:

a ring oscillator for generating signal pulses;

a capacitor in series with said ring oscillator for stretching said signal pulses; and switching and clamping circuitry in series with said capacitor for shaping said stretched signal pulses and outputting said charge pumping signal with a voltage, $V_{p\text{-}tub}$, and a current, $I_{p\text{-}tub}$.

11. The charge pumped semiconductor device of claim 9, wherein said at least one p-tub current threshold includes a minimum current threshold that is a function substrate temperature.

12. The charge pumped semiconductor device of claim 11, wherein said at least one n-tub current threshold further includes a maximum current threshold that is a function of substrate temperature.

13. A method of charge pumping a first region of an integrated circuit comprising:

providing an integrated circuit comprising:

a n-type substrate with a top surface and a lower bulk region;

an p-tub with first and second ends formed within said n-type substrate;

an p-well formed in said n-type substrate electrically coupled to said p-tub at said first and said second ends;

an inner n-well formed in said n-type substrate near said top surface and isolated from said lower bulk region by said p-tub and said p-well;

an outer n-well surrounding and concentric to said p-well and electrically coupled to said lower bulk region; and charge pumping circuitry with an enable state and a disable state coupled to said p-well for generating a charge pumping signal for pumping charge into said p-tub;

applying $V_{BB}$ to said inner n-well of the integrated circuit;

pumping current into said n-tub via said p-well first region to bias the p-tub to a bias voltage magnitude exceeding supply voltage magnitude, $V_{CC}$;

testing said current relative to a maximum current threshold; and switching said charge pumping circuitry into said disable state when the current magnitude rises to said maximum current threshold.

14. The method of claim 13, further comprising:

testing said current relative to a minimum current threshold; and switching said charge pumping circuitry into said enable state when the current magnitude falls to said minimum current threshold.

* * * * *

UNITED STATES PATENT AND TRADEMARK OFFICE
CERTIFICATE OF CORRECTION

PATENT NO. : 6,111,282
DATED : August 29, 2000
INVENTOR(S) : Fernando Gonzalez

It is certified that error appears in the above-identified patent and that said Letters Patent is hereby corrected as shown below:

Title page,
Item [57], ABSTRACT,
Line 8, after "magnitude" delete ",".

Column 1,
Line 16, after "and" insert -- , --;
Line 42, before "p-well" insert -- center --;
Line 47, before "p-well" insert -- center --;
Line 58, after "forming the" insert -- center -- and change "p-substrate" to -- p-type substrate --;

Column 4,
Line 35, change "$V_{cc}$" to -- $V_{ccp}$ --;
Line 47, change "35" to -- 35/56 --;

Column 5,
Line 5, after "The" insert -- temperature --;
Line 17, change "bis" to -- is --;
Line 30, change "well" to -- p-well --; and
Line 40, change "of-temperature" to -- of temperature --.

Column 6,
Line 20, change "charge pumped" to -- charge-pumped --;
Line 30, change "charge pumped" to -- charge-pumped --;
Line 39, change "charge pumped" to -- charge-pumped --;
Line 43, change "charge pumped" to -- charge-pumped --;

Column 7,
Line 1, change "VBB" to -- $V_{BB}$ --;
Line 18, change "a n-type" to -- an n-type --;
Line 20, change "an" to -- a --;
Line 22, change "an" to -- a --.
Line 32, change "charge pumped" to -- charge-pumped --;
Line 42, change "charge pumped" to -- charge-pumped --;

UNITED STATES PATENT AND TRADEMARK OFFICE
CERTIFICATE OF CORRECTION

PATENT NO.     : 6,111,282
DATED          : August 29, 2000
INVENTOR(S)    : Fernando Gonzalez It is certified that error appears in the above-identified patent and that said Letters Patent is hereby corrected as shown below:

Column 8,
Line 5, change "charge pumped" to -- charge-pumped --;
Line 9, change "charge pumped" to -- charge-pumped --;
Line 10, change "n-tub" to -- p-tub --;
Line 16, change "a n-type" to -- an n-type --;
Line 18, change "an" to -- a --;
Line 20, change "an" to -- a --; and
Line 34, change "n-tub" to -- p-tub --.

Signed and Sealed this

Sixteenth Day of July, 2002

*Attest:*

JAMES E. ROGAN
*Attesting Officer*      *Director of the United States Patent and Trademark Office*